United States Patent
Liu

(10) Patent No.: US 7,130,200 B1
(45) Date of Patent: Oct. 31, 2006

(54) PCI CARD-SECURING MECHANISM

(75) Inventor: Yung-Lung Liu, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 11/323,633

(22) Filed: Jan. 3, 2006

(51) Int. Cl.
*H05K 7/12* (2006.01)

(52) U.S. Cl. ............... 361/801; 361/732; 361/747; 361/759; 312/223.2; 211/41.17

(58) Field of Classification Search ............ 361/726, 361/732, 740, 747, 759, 801; 211/41.17; 312/223.1–3
See application file for complete search history.

(56) References Cited

U.S. PATENT DOCUMENTS 6,693,800 B1 * 2/2004 Lin et al. ............... 361/759
6,834,766 B1 * 12/2004 Lin et al. ............... 211/41.17
7,002,811 B1 * 2/2006 Jing et al. ............... 361/801
7,035,085 B1 * 4/2006 Lee ............... 361/624
7,057,903 B1 * 6/2006 Kuo ............... 361/801

\* cited by examiner

*Primary Examiner*—Kamand Cuneo
*Assistant Examiner*—Dameon E. Levi
(74) *Attorney, Agent, or Firm*—Rabin & Berdo, P.C.

(57) ABSTRACT

A PCI card-securing mechanism includes an external housing and a securing component. The external housing has a frame and a receiving plate extending upwardly from the frame. The frame forms with a plurality of slit ports for exposing the PCI card. The receiving plate has a pair of guiding grooves parallel to the slit ports and a pair of assembling slots formed on a top edge thereof. The securing component has a main portion forming a pair of setting bridges, a pair of pulling parts extending outwardly from a top edge of the main portion and a pressing plate bent from a bottom edge of the main portion. The pair of setting bridges are slidably assembled in the pair of guiding grooves, respectively. The pulling parts are disposed in the assembling slots, respectively. The pressing plate presses an edge of the frame to fix the PCI card.

9 Claims, 8 Drawing Sheets

PCI CARD-SECURING MECHANISM

BACKGROUND OF THE INVENTION

1. Field of the Invention

The present invention relates to a PCI card-securing mechanism for fixing PCI cards (Peripheral Component Interconnect cards) to a host housing of a PC, and particularly to a PCI card-securing mechanism that requires neither tools nor screws.

2. Description of the Prior Art

PCI cards (Peripheral Component Interconnect cards) have been widely used in computers for quite some time. PCI is a kind of bus structure, which is used for connecting to modem cards, monitor cards, sound cards or other peripheral equipment.

The common fixing manner for PCI cards almost uses screws. Such a manner not only requires the screws themselves but also a screwdriver. The operation way is often time-consuming and troublesome, and the screws are easily lost. Moreover, if a screw falls on the PCB and is not noticed, the PCB will happen short when the computer is turned on and great amounts of damage is done thereby to the computer.

With the above-described problems of the prior art in view, an object of the present invention is to provide a PCI card-securing mechanism that overcomes the disadvantages of the prior art.

SUMMARY OF THE INVENTION

An object of the present invention is to provide a PCI card-securing mechanism that can fix and disassemble PCI cards to a PCB without requiring screws, other tools, or objects. In this way the problems of the prior art, such as screws falling on the PCB and causing a short, and the PCI cards being difficult and slow to assemble and disassemble are overcome. Users of the present invention will spend less time assembling and disassembling the PCI card and won't have to worry about loosing the screws needed in the prior art.

In order to achieve the above objects, the present invention according to one aspect thereof provides a PCI card-securing mechanism including an external housing and a securing component. The external housing has a frame formed with a plurality of slit ports for respectively exposing the PCI cards and a receiving plate extending upwardly from the frame. The receiving plate is formed with a pair of guiding grooves parallel to the slit ports, and a pair of assembling slots formed on a top edge of the receiving plate. The securing component has a main body, a pair of pulling parts and a pressing plate. The main body is formed with a pair of setting bridges thereon and slidably mounted in said pair of guiding grooves. The pair of pulling parts extends outwardly from a top edge of the main body and respectively disposed in the assembling slots. The pressing plate is bent from a bottom edge of the main body. The pressing plate abuts against an edge of the frame for securing the PCI cards.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
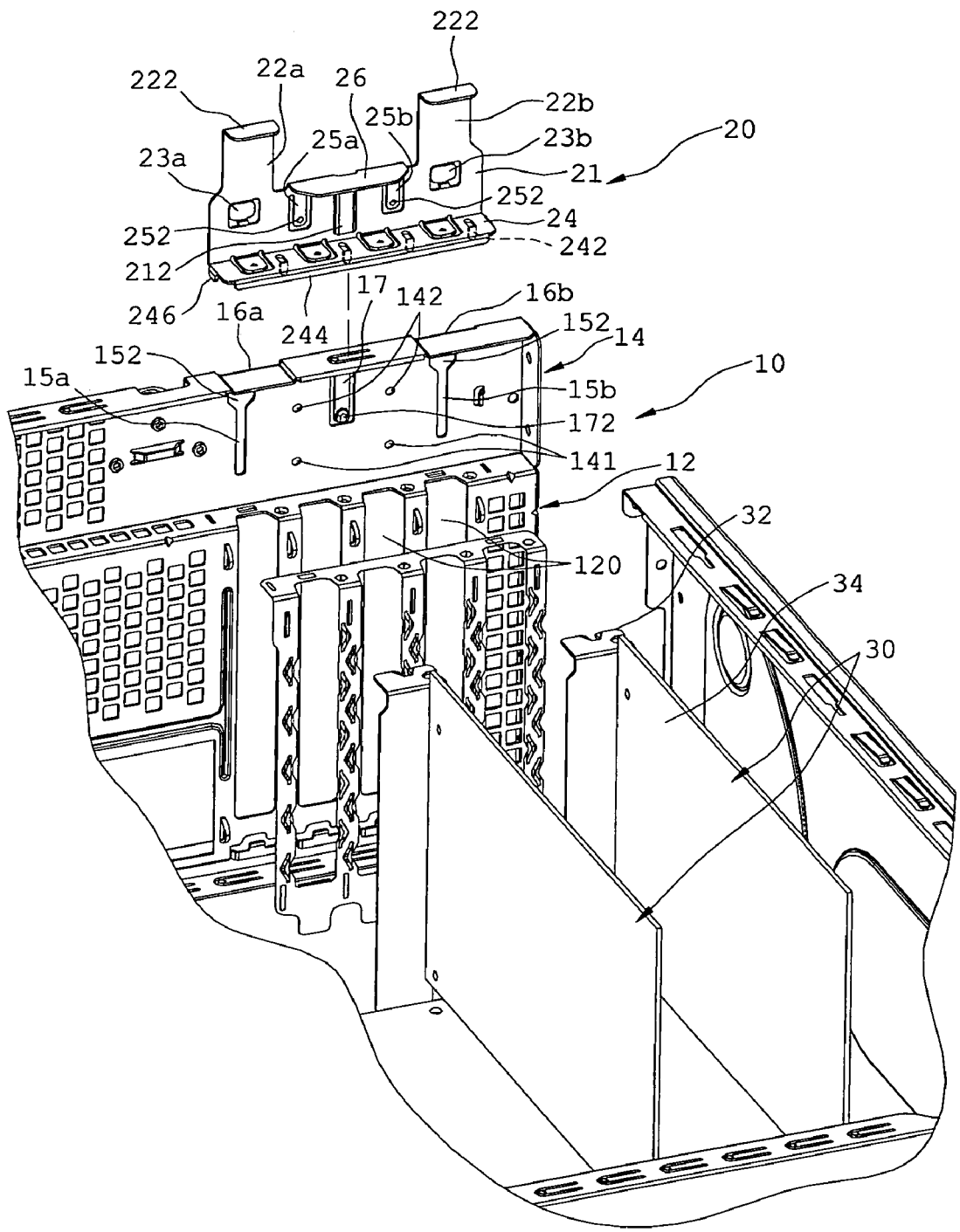
FIG. 1 is an exploded perspective view of a PCI card-securing mechanism according to the present invention.
Figure 2:
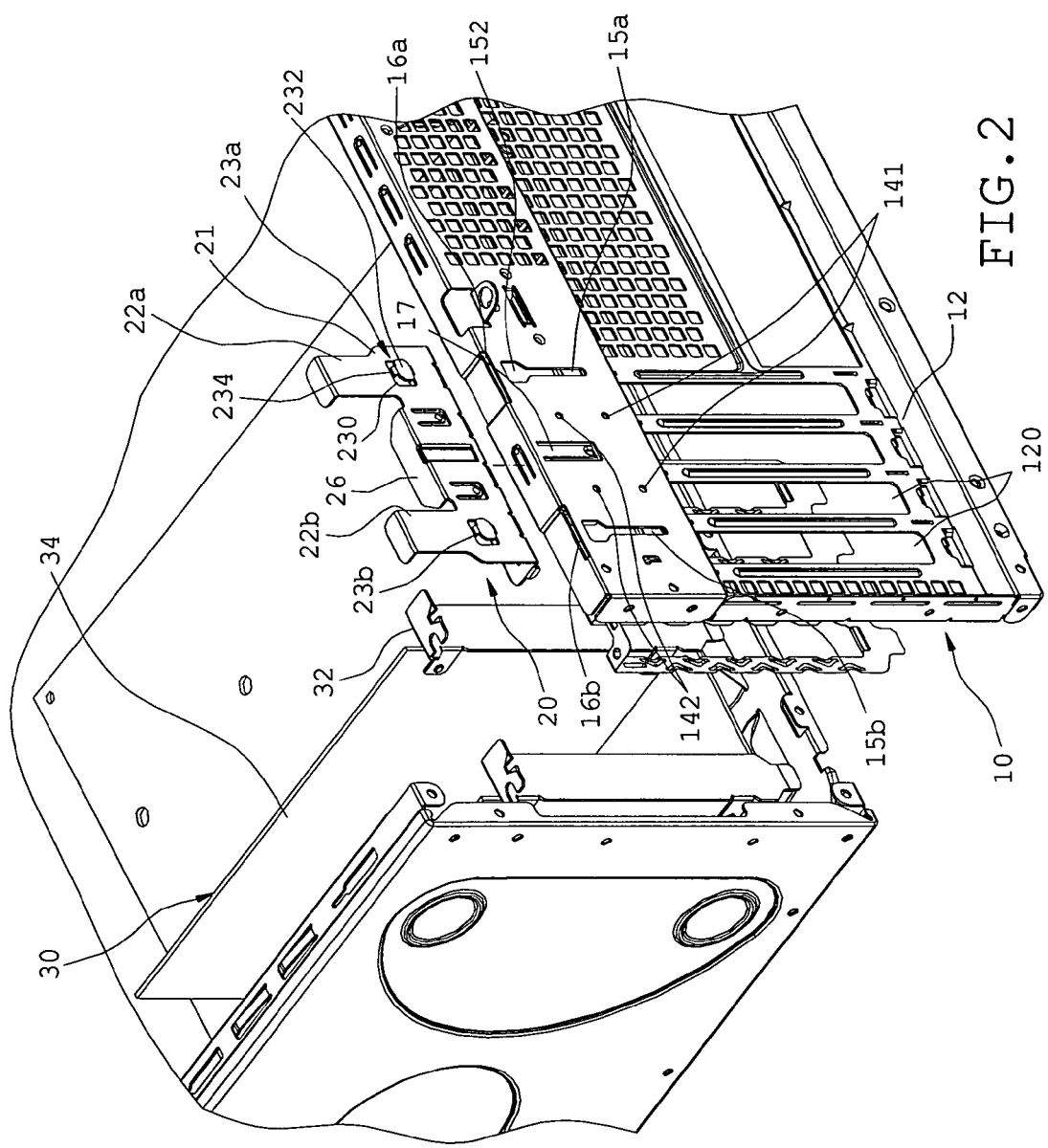
FIG. 2 is another exploded perspective view of the PCI card-securing mechanism according to the present invention.

Referring to FIGS. 1 and 2, which are exploded perspective views of a PCI card-securing mechanism according to the present invention. The present invention provides a PCI card-securing mechanism for fixing PCI cards 30 to a host housing. The PCI card-securing mechanism includes an external housing 10 and a securing component 20.

In this embodiment, the external housing 10 is a rear board of the external housing 10, which has a frame 12 and a receiving plate 14 that extends upwardly from the frame 12. The frame 12 forms with a plurality of slit ports 120 for exposing the PCI card 30. The receiving plate 14 has a pair of guiding grooves 15a and 15b, which are parallel to the slit port 120 and a pair of assembling slots 16a, 16b formed on a top edge of the receiving plate 14.

In this embodiment, the pair of assembling slots 16a, 16b match with the pair of guiding grooves 15a and 15b. Moreover, the pair of guiding grooves 15a, 15b of the receiving plate 14 are substantially T-shaped and form an assembling cutout 152 on a top end thereof.

The securing component 20 has a main body 21, a pair of pulling part 22a, 22b extended outwardly from a top edge of the main body 21, and a pressing plate 24 bent from a bottom edge of the main body 21. The pulling parts 22a, 22b have a stopping tab 222 bent from a top end thereof. The pair of pulling parts 22a, 22b after assembly are respectively located in the pair of assembling slots 16a, 16b of the external housing 10. The pressing plate 24 is used for pressing a top edge of the frame 12 for fixing a slot tab 32 of the PCI cards 30.

Reference is made to FIG. 2 in which the main body 21 has a pair of setting bridges 23a, 23b respectively slidably mounted in the pair of guiding grooves 15a, 15b. In this embodiment, the pair of setting bridges 23a, 23b are formed by punching the main body 21. Each of the setting bridges 23a, 23b has a punching hole 230 formed on the main body 21, a pair of linking legs 234 extended from an edge of the punching hole 230 and a sliding part 232 located between the pair of linking legs 234. The sliding part 232 has an area that is smaller than that of the assembling cutout 152, so that the pair of setting bridges 23a, 23b are respectively assembled in the pair of guiding grooves 15a, 15b.

The securing component 20 further includes a stopping part 26 bent from a top edge of the main body 21 and located between the pair of pulling parts 22a, 22b. The stopping part 26 is stopped at a top edge of the receiving plate 14.

[Assembling Steps]

Figure 3:
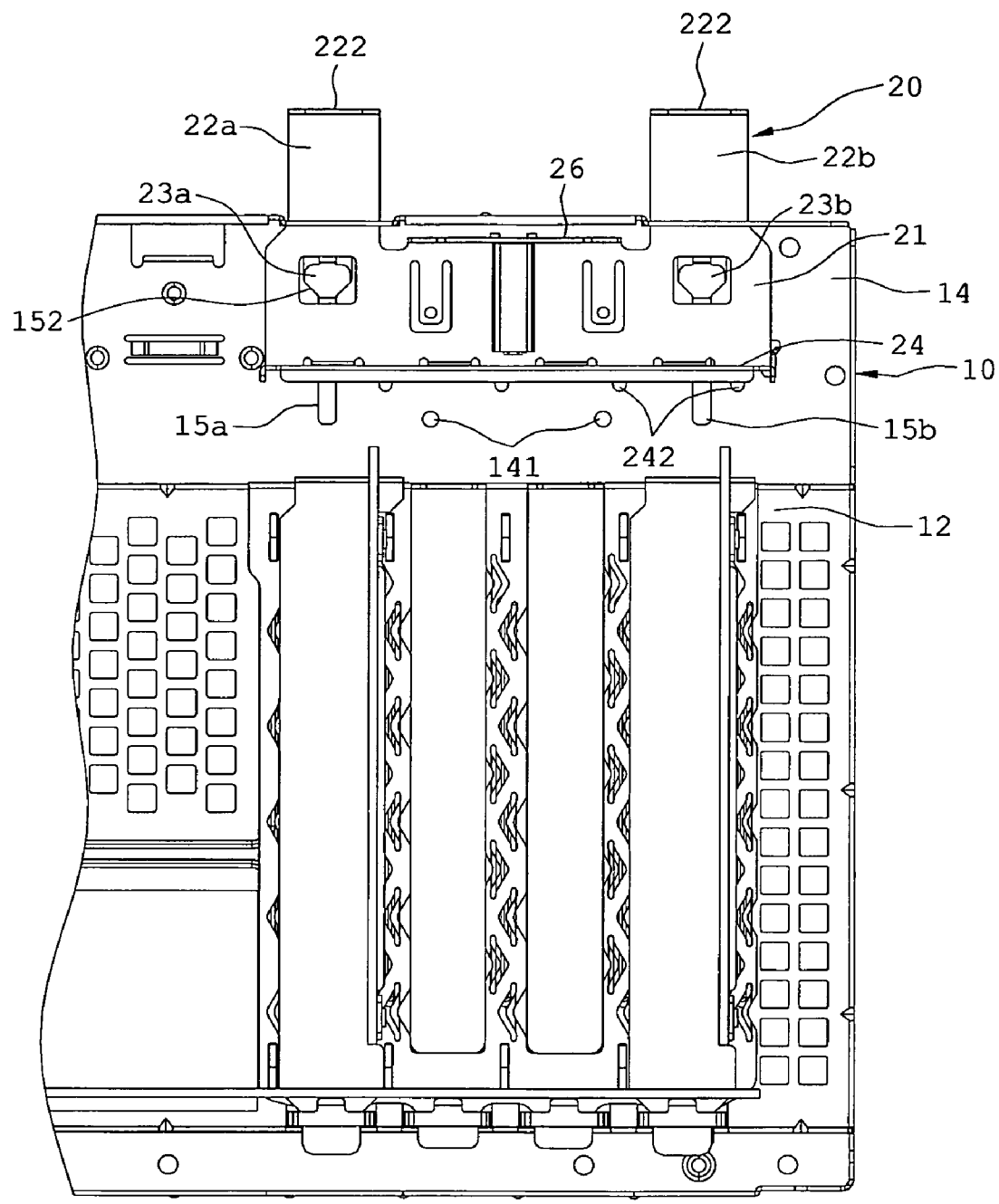
FIG. 3 is an assembled perspective view of the PCI card-securing mechanism (without any PCI cards) according to the present invention.
Figure 4:
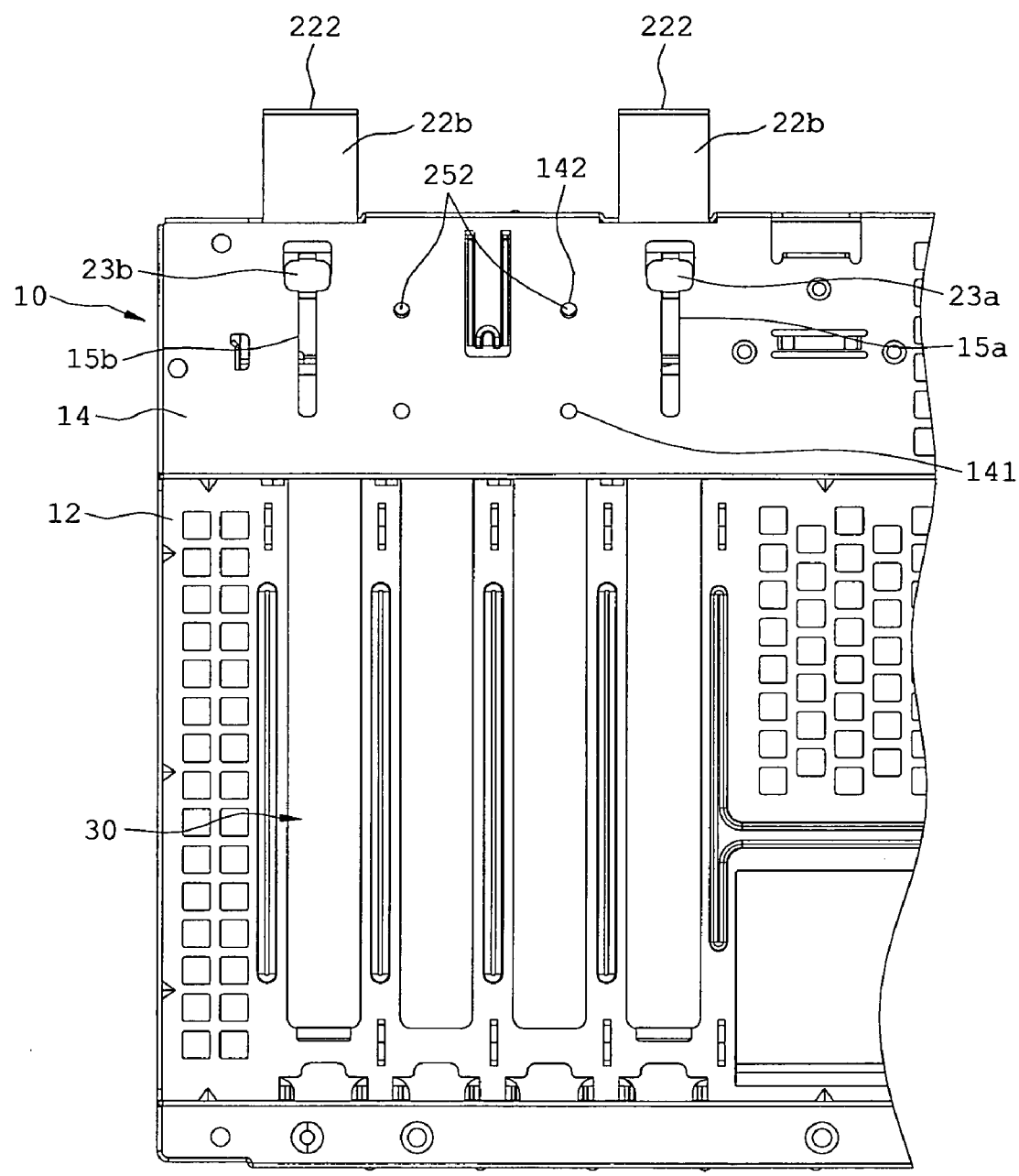
FIG. 4 is another assembled perspective view of the PCI card-securing mechanism (without any PCI cards) according to the present invention.

The assembling steps of the present invention are described as follows. First, the pulling parts 22a, 22b of the securing component 20 are inserted in an inclined manner into the pair of assembling slots 16a, 16b from an inner side of the receiving plate 14. Then, the main body 21 of the securing component 20 is pushed outwardly, and the pair of setting bridges 23a, 23b of the main body 21 are pushed into the pair of guiding grooves 15a, 15b of the receiving plate 14 from the assembling cutout 152. The linking legs 234 of the setting bridge 23a, 23b can slide into the pair of guiding grooves 15a, 15b. After assembly, as shown in FIG. 3 and FIG. 4, which are assembled perspective views of the PCI card-securing mechanism (without any PCI cards) according to the present invention.

Please refer to FIG. 1. To make the securing component 20 slide more smoothly related to the receiving plate 14 in the present invention, the main body 21 of the securing component 20 further has a pair of positioning elastic-tabs 25a, 25b which abut against the receiving plate 14 elastically. The positioning elastic-tabs 25a, 25b are formed with a positioning protrusion 252 at a free end thereof, respectively. The receiving plate 14 forms a plurality of positioning holes 141, 142 corresponding to the positioning elastic-tabs 25a, 25b. Therefore, friction between the securing component 20 and the receiving plate 14 is lowered, and the securing component 20 is assisted in positioning to predetermined positions of the receiving plate 14. For example, the securing component 20 can be pulled and located at an unlocked position (the position of the positioning hole 141) and does not slide down (as shown in FIGS. 3 and 4).

Moreover, in this embodiment, the receiving plate 14 further has an orientating elastic-tab 17. The orientating elastic-tab 17 forms a positioning protrusion 172 at a free end thereof, and the main body 21 of the securing component 20 forms a guiding track 212 corresponding to the orientating elastic-tab 17.

To fix the PCI cards 30 in the present invention, the pressing plate 24 of the securing component 20 is punched downwardly and formed with a plurality of stopping protrusive-tabs 242 for fixing the slot tab 32 of the PCI card 30. Moreover, the pressing plates 24 of the securing component 20 respectively form retaining edges 244, 246 bent downwardly from an edge thereof.

[Operating Way]

Figure 5:
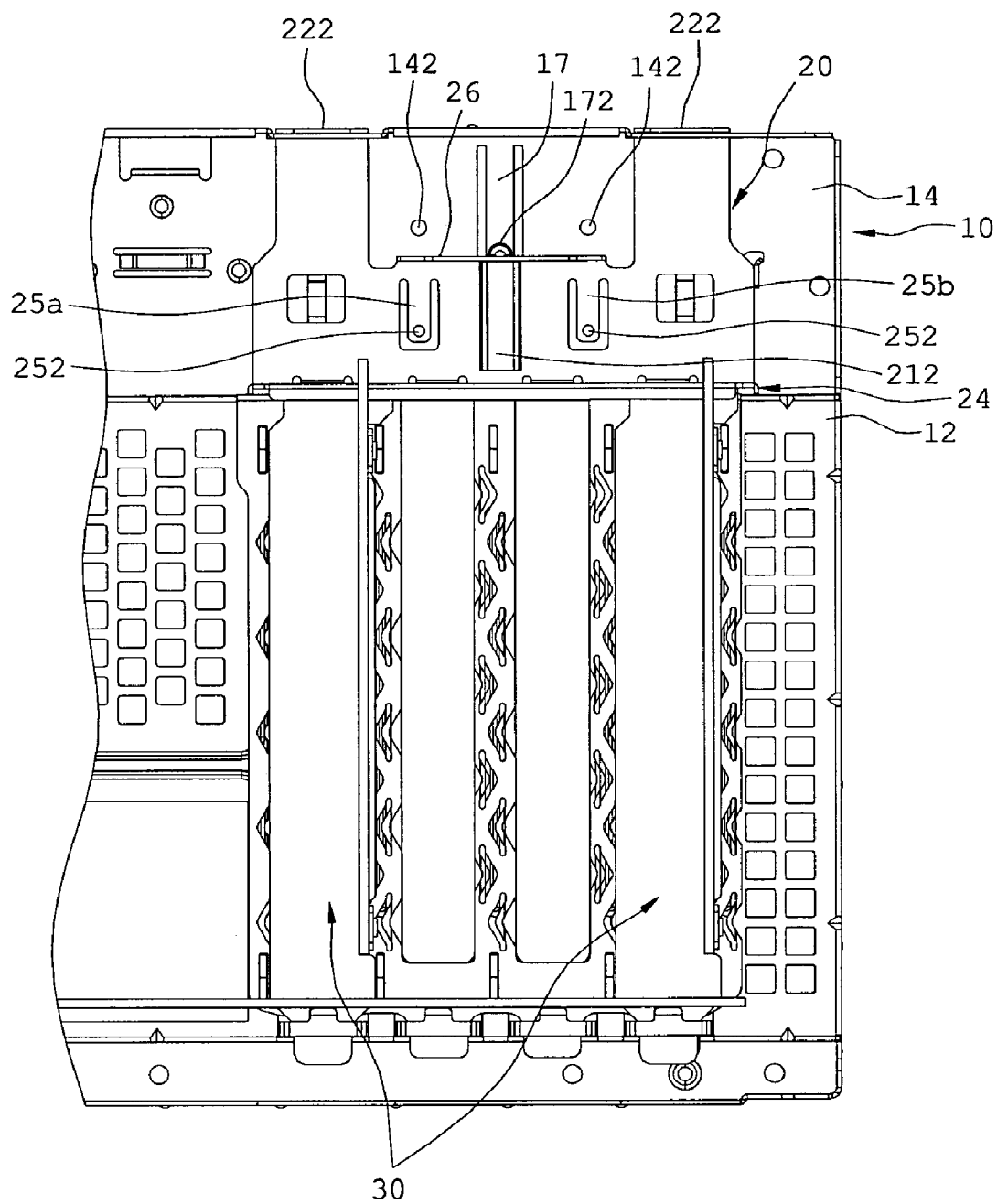
FIG. 5 is a front view of the PCI card-securing mechanism (with PCI cards) according to the present invention.
Figure 6:
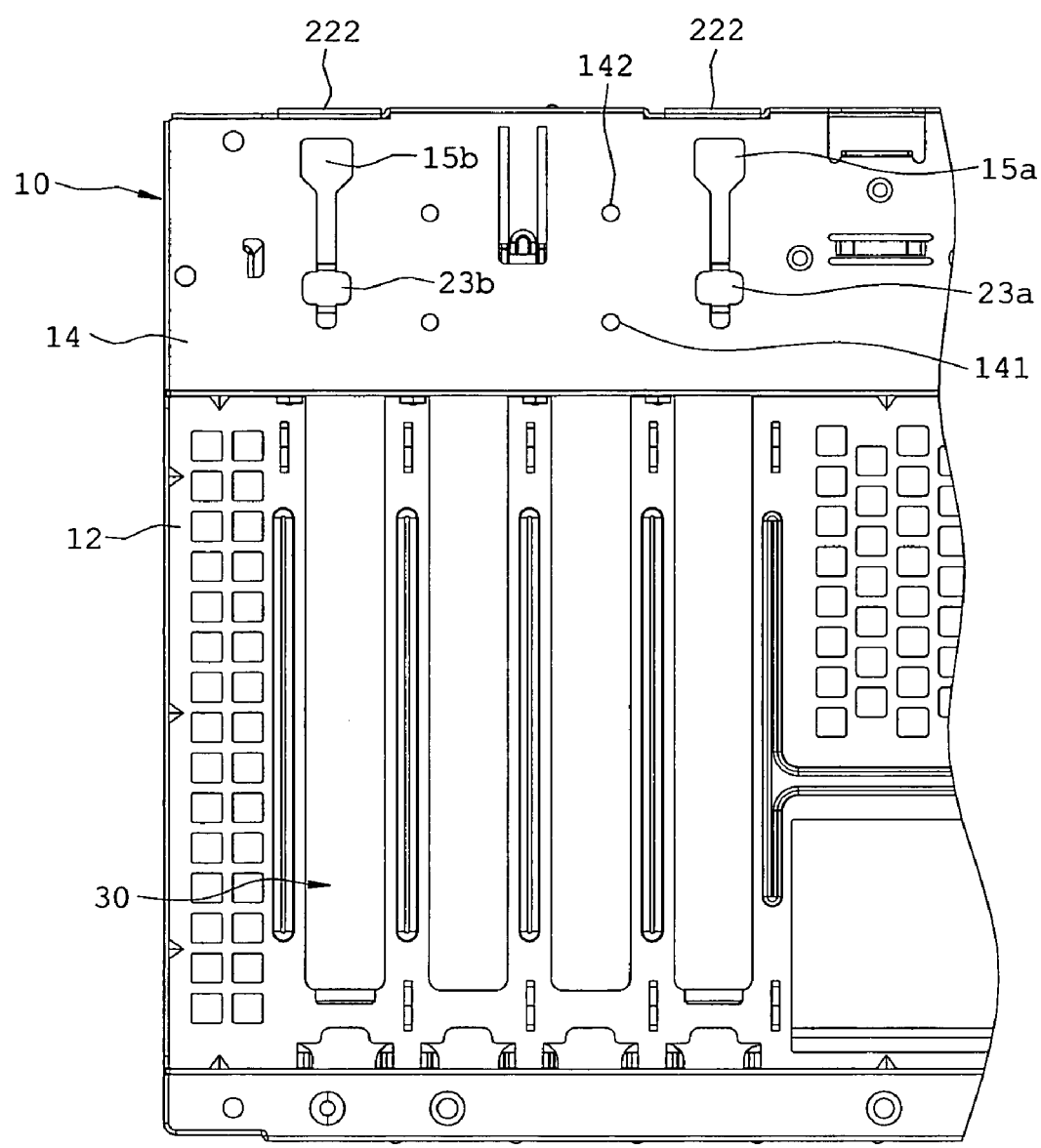
FIG. 6 is a rear view of the PCI card-securing mechanism (with PCI cards) according to the present invention.

Reference is made in FIGS. 5 and 6, which are a front view and rear view of the PCI card-securing mechanism (with PCI cards) according to the present invention. The operating processes of the present invention are described as followed. If the PCI cards 30 need to be locked in position, pressing down upon the stopping tab 222 of the securing component 20 makes the PCI cards 30 fix firmly into their slot tabs 32. The setting bridges 23a, 23b slide downwardly along the pair of guiding grooves 15a, 15b, and the pressing plate 24 moves down to fix the PCI card 30.

Figure 7:
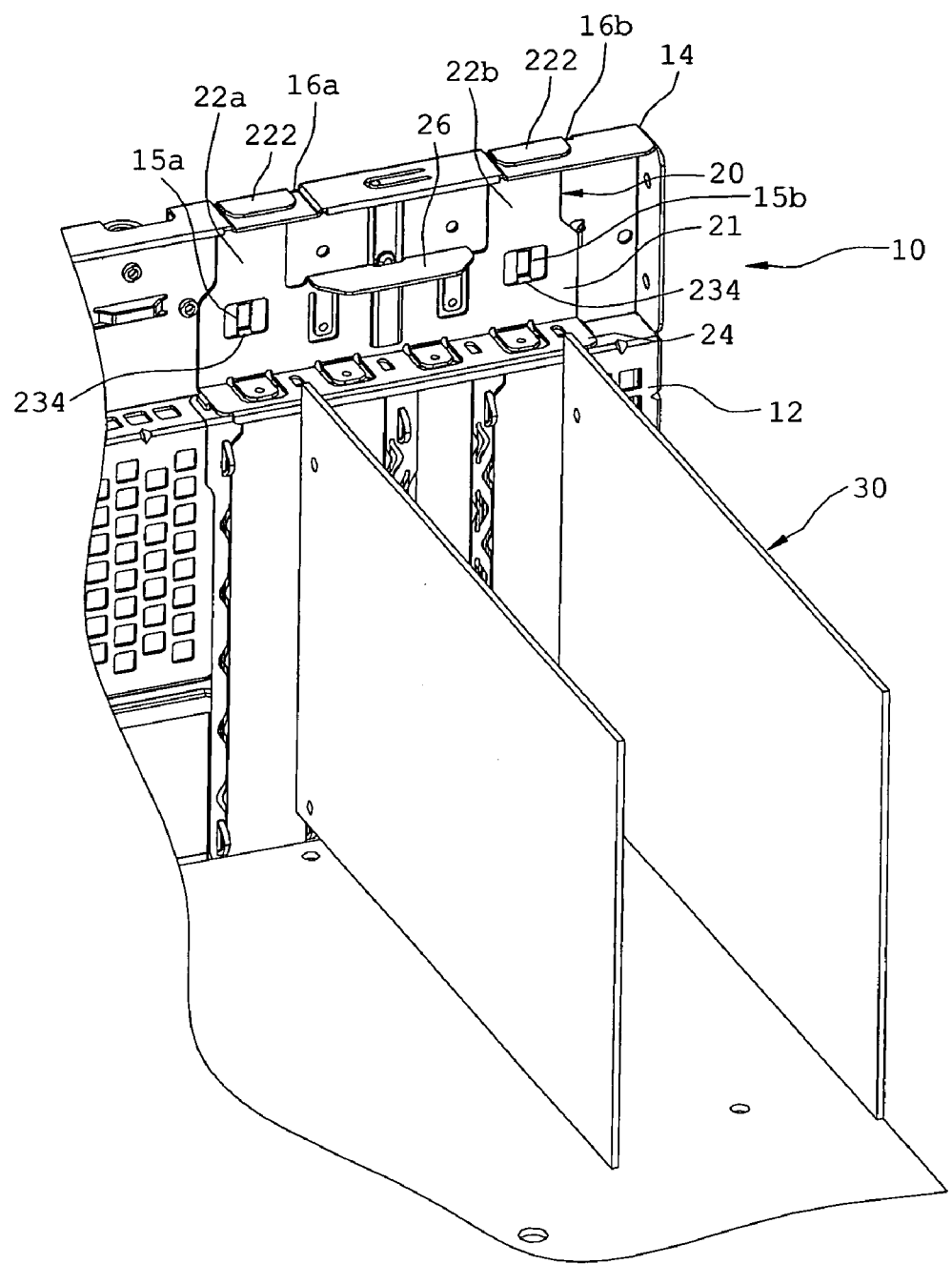
FIG. 7 is an assembled perspective view of the PCI card-securing mechanism (with PCI cards) according to the present invention.
Figure 8:
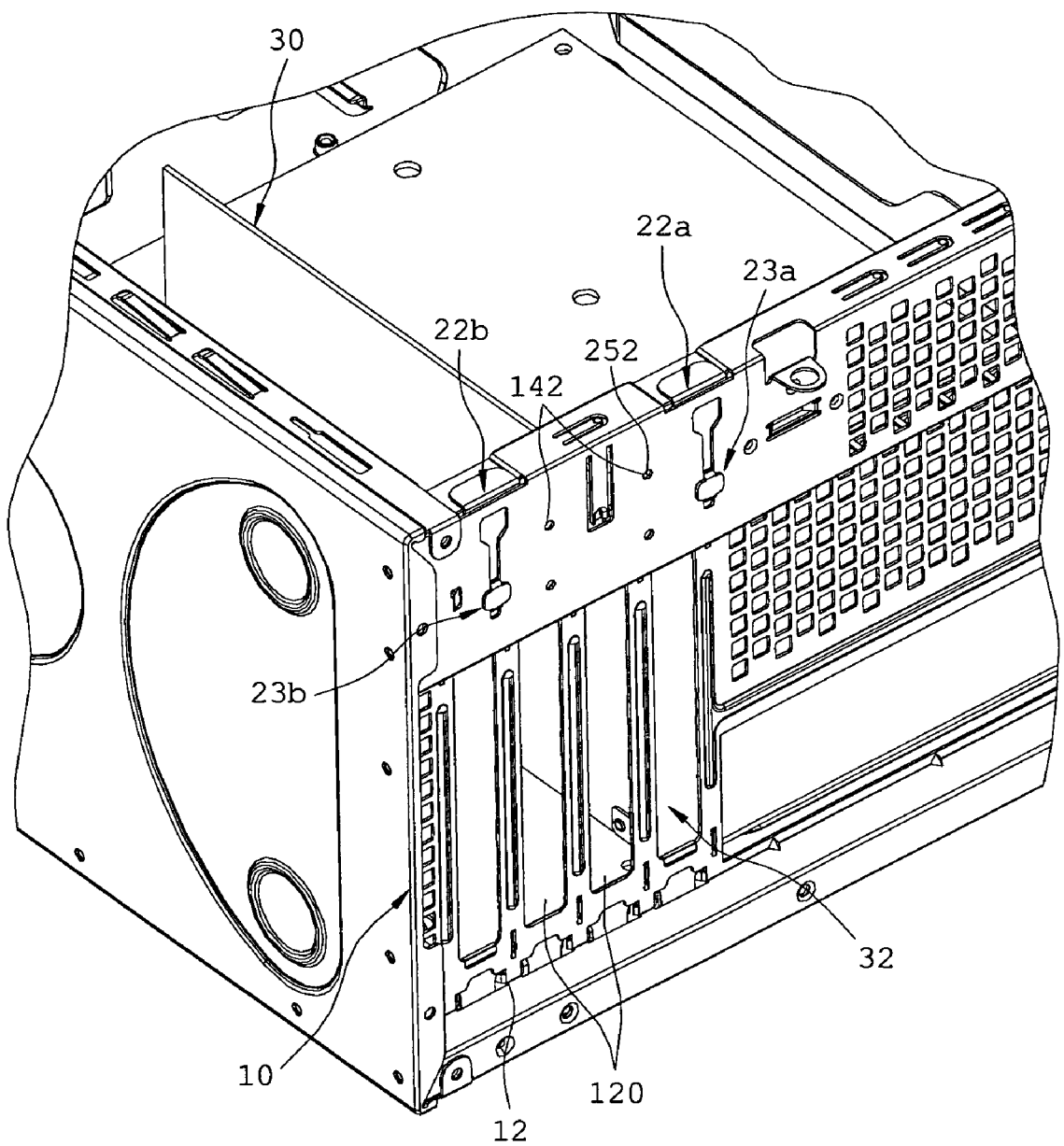
FIG. 8 is another assembled perspective view of the PCI card-securing mechanism (with PCI cards) according to the present invention.

Reference is made in FIGS. 7 and 8, which are assembled perspective views of the PCI card-securing mechanism (with PCI cards) according to the present invention. If the PCI cards need to be disassembled, the stopping part 26 must be pulled up, and the pressing plate 24 unlocks the PCI card 30 so that it may be removed by the user. Therefore, the present invention provides an easy method of locking and disassembling the PCI cards.

[The Characters and Advantages of the Present Invention]

The characteristics and advantages of the present invention are as follows:

1. The PCI card-securing mechanism of the present invention requires neither disassembling tools nor screws. Simply pulling the securing component upwardly unlocks the PCI card quickly from its fixed status; pushing the securing component down fixes the PCI card securely.

2. The PCI card-securing mechanism of the present invention applies metal pieces to the design of the elastic track and rail, and applies the retaining edges 244, 246 of the pressing plate 24 or the stopping protrusive-tabs 242 for fixing the PCI card.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A PCI card-securing mechanism for securing PCI cards, comprising:

an external housing having a frame formed with a plurality of slit ports for respectively exposing said PCI cards, and a receiving plate extending upwardly from said frame, said receiving plate formed with a pair of guiding grooves paralleled to said slit ports, and a pair of assembling slots formed on a top edge of said receiving plate; and a securing component having a main body formed with a pair of setting bridges thereon and slidably mounted in said pair of guiding grooves, a pair of pulling parts extending outwardly from a top edge of said main body and respectively disposed in said assembling slots, and a pressing plate bent from a bottom edge of said main body, said pressing plate abutting against an edge of the frame for securing said PCI cards.

2. The PCI card-securing mechanism as in claim 1, wherein said assembling slots match said guiding grooves.

3. The PCI card-securing mechanism as in claim 1, wherein said setting bridges of said securing component are respectively punched on said main body, and wherein each said pair of setting bridges has a punching hole formed on said main body, a pair of linking legs extending from an edge of said punching holes and a sliding part located between said pair of linking legs.

4. The PCI card-securing mechanism as in claim 3, wherein said guiding grooves of said receiving plate are substantially T-shaped and form an assembling cutout located at a top of said guiding grooves, said assembling cutout is larger than said sliding part.

5. The PCI card-securing mechanism as in claim 1, further comprising a stopping part bent from a top end of said main body and between said pulling parts, said stopping part is stopped against a top of said receiving plate.

6. The PCI card-securing mechanism as in claim 1, wherein said main body of said securing component further comprises at least one positioning elastic-tab formed thereon, said positioning elastic-tab respectively forms a positioning protrusion at a free end thereof, and said receiving plate forms at least one positioning hole corresponding to said at least one positioning elastic-tab.

7. The PCI card-securing mechanism as in claim 1, wherein said receiving plate further comprises a orientating elastic-tab, said orientating elastic-tab forms a positioning protrusion on a free end thereof, and said main body of said securing component forms a guiding track corresponding to said orientating elastic-tab.

8. The PCI card-securing mechanism as in claim 1, wherein said pressing plate of said securing component has a plurality of stopping protrusive-tabs formed by punching downwardly for fixing said PCI card.

9. The PCI card-securing mechanism as in claim 1, wherein each edge of said pressing plate of said securing component is bent downwardly to form a retaining edge respectively thereof for retaining said PCI card.

* * * * *